(12) United States Patent
Ji (10) Patent No.: US 12,557,704 B2
(45) Date of Patent: Feb. 17, 2026

(54) SEMICONDUCTOR DEVICE

(71) Applicant: MEDIATEK Inc., Hsinchu (TW)

(72) Inventor: Yan-Liang Ji, Hsinchu (TW)

(73) Assignee: MEDIATEK INC., Hsinchu (TW)

( * ) Notice: Subject to any disclaimer, the term of this patent is extended or adjusted under 35 U.S.C. 154(b) by 495 days.

(21) Appl. No.: 18/152,187

(22) Filed: Jan. 10, 2023

(65) Prior Publication Data

US 2023/0260976 A1 Aug. 17, 2023

Related U.S. Application Data

(60) Provisional application No. 63/311,109, filed on Feb. 17, 2022.

(51) Int. Cl.

| | |
|---|---|
| *H01L 25/16* | (2023.01) |
| *H01L 23/00* | (2006.01) |
| *H01L 23/31* | (2006.01) |
| *H01L 23/48* | (2006.01) |
| *H01L 23/522* | (2006.01) |
| *H10D 1/68* | (2025.01) |

(52) U.S. Cl.
CPC .......... *H01L 25/16* (2013.01); *H01L 23/3128* (2013.01); *H01L 23/3157* (2013.01); *H01L 23/481* (2013.01); *H01L 23/5226* (2013.01); *H01L 24/14* (2013.01); *H01L 24/16* (2013.01); *H10D 1/68* (2025.01); *H01L 2224/14181* (2013.01); *H01L 2224/16225* (2013.01); *H01L 2224/16265* (2013.01)

(58) Field of Classification Search
CPC . H01L 25/16; H01L 23/3128; H01L 23/3157; H01L 23/481
See application file for complete search history.

(56) References Cited

U.S. PATENT DOCUMENTS

| | | | | |
|---|---|---|---|---|
| 7,858,441 | B2* | 12/2010 | Lin | H01L 23/5389 |
| | | | | 438/455 |
| 9,397,038 | B1* | 7/2016 | Uzoh | H10D 84/038 |
| 10,510,691 | B2* | 12/2019 | Liu | H01L 23/562 |
| 10,777,636 | B1* | 9/2020 | Paul | H10D 86/01 |
| 10,811,404 | B2* | 10/2020 | Huang | H01L 23/5389 |
| 11,276,749 | B2* | 3/2022 | Paul | H10D 86/01 |
| 11,587,900 | B2* | 2/2023 | Tseng | H01L 24/19 |
| 12,068,212 | B2* | 8/2024 | Tai | H01L 23/5226 |

(Continued)

FOREIGN PATENT DOCUMENTS

| | | | | | |
|---|---|---|---|---|---|
| CN | 102856303 | A | * | 1/2013 | ............ H01L 24/18 |
| CN | 101682252 | B | * | 10/2013 | ........... H10D 84/212 |

(Continued)

OTHER PUBLICATIONS

Voiron, et al.: Silicon High-Density Capacitors for Power Decoupling Applications; 978-1-4799-9883-8/15/$31.00 © 2015 IEEE; pp. 48-51.

(Continued)

*Primary Examiner* — Laura M Menz (74) *Attorney, Agent, or Firm* — McClure, Qualey & Rodack, LLP (57) ABSTRACT

A semiconductor device includes a semiconductor component and a silicon-based passive component. The silicon-based passive component is stacked on the semiconductor component in a thickness direction of the semiconductor component.

14 Claims, 9 Drawing Sheets

(56) References Cited

U.S. PATENT DOCUMENTS

| | | | |
|---|---|---|---|
| 12,159,853 B2* | 12/2024 | Tseng | H01L 21/6835 |
| 12,249,578 B2* | 3/2025 | Fang | H01L 23/535 |
| 2013/0094157 A1* | 4/2013 | Giuliano | H01L 23/5227 |
| | | | 361/748 |
| 2015/0102395 A1* | 4/2015 | Park | H10D 1/047 |
| | | | 257/301 |
| 2019/0131285 A1* | 5/2019 | Kim | H01L 25/165 |
| 2019/0371781 A1* | 12/2019 | Huang | H01L 23/5383 |
| 2020/0075510 A1* | 3/2020 | Chang Chien | H01L 21/486 |
| 2020/0402892 A1* | 12/2020 | Chen | H01L 25/0657 |
| 2021/0020736 A1* | 1/2021 | Paul | H10D 1/716 |
| 2021/0043557 A1* | 2/2021 | Lee | H01L 24/19 |
| 2021/0358915 A1* | 11/2021 | Wang | H10B 12/30 |
| 2022/0189920 A1* | 6/2022 | Liao | H01L 23/3185 |
| 2022/0238406 A1* | 7/2022 | Tai | H01L 21/561 |
| 2022/0278067 A1* | 9/2022 | Tseng | H01L 24/82 |
| 2022/0415799 A1* | 12/2022 | Fang | H01L 24/32 |
| 2023/0154881 A1* | 5/2023 | Tseng | H01L 24/82 |
| | | | 257/773 |
| 2023/0260976 A1* | 8/2023 | Ji | H10D 1/716 |
| | | | 257/774 |
| 2024/0096861 A1* | 3/2024 | Kuo | H01L 23/3128 |
| 2024/0213140 A1* | 6/2024 | Then | H01L 23/5226 |
| 2024/0355802 A1* | 10/2024 | Wu | H01L 24/32 |
| 2024/0363576 A1* | 10/2024 | Chou | H01L 24/26 |
| 2025/0031376 A1* | 1/2025 | Lee | H10D 1/716 |
| 2025/0038074 A1* | 1/2025 | Hsiao | H01L 23/5226 |
| 2025/0054894 A1* | 2/2025 | Tseng | H01L 24/24 |
| 2025/0201690 A1* | 6/2025 | Yang | H01L 23/642 |
| 2025/0253230 A1* | 8/2025 | Liu | H01L 25/0657 |

FOREIGN PATENT DOCUMENTS

| | | | | | |
|---|---|---|---|---|---|
| CN | 104377172 A | * | 2/2015 | | H01L 23/492 |
| CN | 104617078 A | * | 5/2015 | | H01L 24/05 |
| CN | 102856303 B | * | 7/2015 | | H01L 24/18 |
| CN | 106169466 A | * | 11/2016 | | H01L 24/94 |
| CN | 104377172 B | * | 8/2017 | | H01L 25/16 |
| CN | 104617078 B | * | 2/2018 | | H01L 24/05 |
| CN | 106571357 B | * | 8/2019 | | H01L 23/5223 |
| CN | 115132699 A | * | 9/2022 | | H01L 23/5223 |
| CN | 116613152 A | * | 8/2023 | | H01L 25/16 |
| CN | 117747593 A | * | 3/2024 | | |
| CN | 119028950 A | * | 11/2024 | | H01L 23/522 |
| DE | 102014109909 B4 | * | 8/2020 | | H01L 23/5389 |
| DE | 102010002627 B4 | * | 10/2023 | | H02M 7/003 |
| EP | 2816624 A1 | * | 12/2014 | | H10D 1/716 |
| EP | 2816624 B1 | * | 12/2021 | | H10D 1/716 |
| EP | 4235782 A1 | * | 8/2023 | | H10D 1/68 |
| FR | 3007197 A1 | * | 12/2014 | | H10D 1/716 |
| JP | 2006086475 A | * | 3/2006 | | H10D 1/665 |
| TW | 202518736 A | * | 5/2025 | | H10D 1/68 |
| WO | WO-2007005141 A1 | * | 1/2007 | | H10D 1/665 |
| WO | WO-2016137895 A1 | * | 9/2016 | | H01L 23/5223 |
| WO | WO-2020117406 A1 | * | 6/2020 | | H01L 23/528 |
| WO | WO-2024137283 A1 | * | 6/2024 | | H10D 1/68 |
| WO | WO-2024258659 A1 | * | 12/2024 | | H10D 89/60 |
| WO | WO-2025107105 A1 | * | 5/2025 | | H03H 1/00 |

OTHER PUBLICATIONS

EP Search Report dated Jul. 27, 2023 in EP application No. 23157036.7-1212.

* cited by examiner

SEMICONDUCTOR DEVICE

This application claims the benefit of U.S. Provisional application Ser. No. 63/311,109, filed Feb. 17, 2022, the disclosure of which is incorporated by reference herein in its entirety.

FIELD OF THE INVENTION

The invention relates to a semiconductor device, and more particularly to a semiconductor device including a silicon-based passive component.

BACKGROUND OF THE INVENTION

Conventional semiconductor device includes a MLCC (Multi-layer Ceramic Capacitor) and a chip. The MLCC has single capacitor structure including two electrodes. In general, the chip and the MLCC are disposed on a substrate side by side, and such configuration cause a larger size of the semiconductor device.

SUMMARY OF THE INVENTION

In an embodiment of the invention, a semiconductor device, comprising is provided. The semiconductor device includes a semiconductor component and a silicon-based passive component. The silicon-based passive component is stacked on the semiconductor component in a thickness direction of the semiconductor component.

In another embodiment of the invention, a semiconductor device, comprising is provided. The silicon-based passive component is stacked above the semiconductor component and includes a plurality of passive structures.

Numerous objects, features and advantages of the invention will be readily apparent upon a reading of the following detailed description of embodiments of the invention when taken in conjunction with the accompanying drawings. However, the drawings employed herein are for the purpose of descriptions and should not be regarded as limiting.

BRIEF DESCRIPTION OF THE DRAWINGS

The above objects and advantages of the invention will become more readily apparent to those ordinarily skilled in the art after reviewing the following detailed description and accompanying drawings, in which.

DETAILED DESCRIPTION OF PREFERRED EMBODIMENTS

Figure 1A:
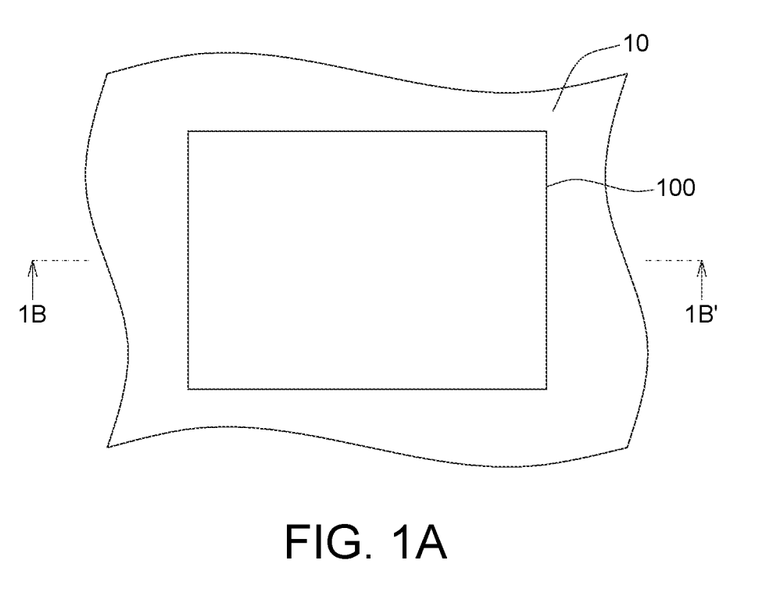
FIG. 1A illustrates a schematic diagram of a top view of a semiconductor device according to an embodiment of the invention.
Figure 1B:
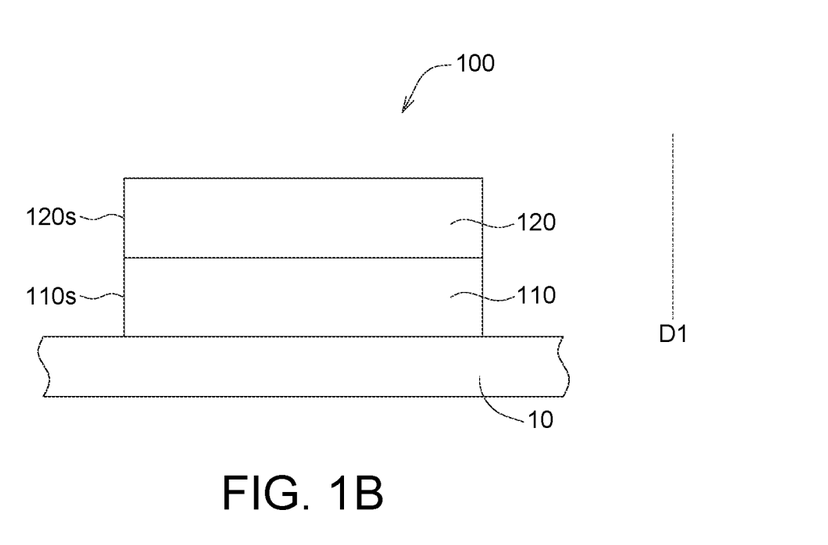
FIG. 1B illustrates a schematic diagram of a cross-sectional view of the semiconductor device in a direction 1B-1B'.

Referring to FIGS. 1A and 1B, FIG. 1A illustrates a schematic diagram of a top view of a semiconductor device 100 according to an embodiment of the invention, and FIG. 1B illustrates a schematic diagram of a cross-sectional view of the semiconductor device 100 in a direction 1B-1B'.

As illustrated in FIGS. 1A and 1B, the semiconductor device 100 includes at least one semiconductor component 110 and at least one silicon-based passive component 120. The silicon-based passive component 120 is stacked on the semiconductor component 110 in a thickness direction D1 of the semiconductor component 110. In the present embodiment, the silicon-based passive component 120 may include at least one passive structure, such as at least one capacitance, at least one resistor and/or at least one inductance, and/or the silicon-based passive component 120 may provide at least one input/output contact. As a result, the silicon-based passive component 120 may support the semiconductor component 110 with high input/output density.

In the present embodiment, the semiconductor component 110 is, for example, a Power Management IC (PMIC). The substrate 110 is, for example, a single-layered structure or a multi-layered structure. The semiconductor component 110 is, for example, a die without packaging or a semiconductor package. For example, the semiconductor component 110 is, for example, a Wafer Level Chip Scale Packaging (WLCSP), a flip-chip Ball Grid Array (BGA), etc. The silicon-based passive component 110 is, for example, silicon-based capacitor.

As illustrated in FIGS. 1A and 1B, due to the silicon-based passive component 120 being stacked on the semiconductor component 110 in the thickness direction D1 of the semiconductor component 110, the size (or area) of the semiconductor device 100 may be reduced. In addition, the size (or area) of the semiconductor component 110 and the size of the silicon-based passive component 120 are substantially equal in top view. In another embodiment, the size (or area) of the semiconductor component 110 and the size of the silicon-based passive component 120 are different in top view. Furthermore, the size of the semiconductor component 110 is greater than or smaller than that of the silicon-based passive component 120.

As illustrated in FIG. 1B, the semiconductor component 110 has a first lateral surface 110s, the silicon-based passive component 120 has a second lateral surface 120s, and the second lateral surface 120s does not protrude with respect to the first lateral surface 110s. For example, the first lateral surface 110s and the second lateral surface 120s are flush with each other. In another embodiment, the second lateral surface 120s may be recessed with respect to the first lateral surface 110s. In other embodiment, the second lateral surface 120s may protrude with respect to the first lateral surface 110s.

In addition, the semiconductor device 100 may be disposed on and electrically connected to a substrate 10. Although not illustrated, the semiconductor device 100 may be disposed on the substrate 10 by, for example, at least one contact, such as solder ball, bump, pillar, etc. In another embodiment, the substrate 10 may belong to the semiconductor device 100. The substrate 110 is, for example, a printed circuit board (PCB), an interposer, etc.

Figure 2:
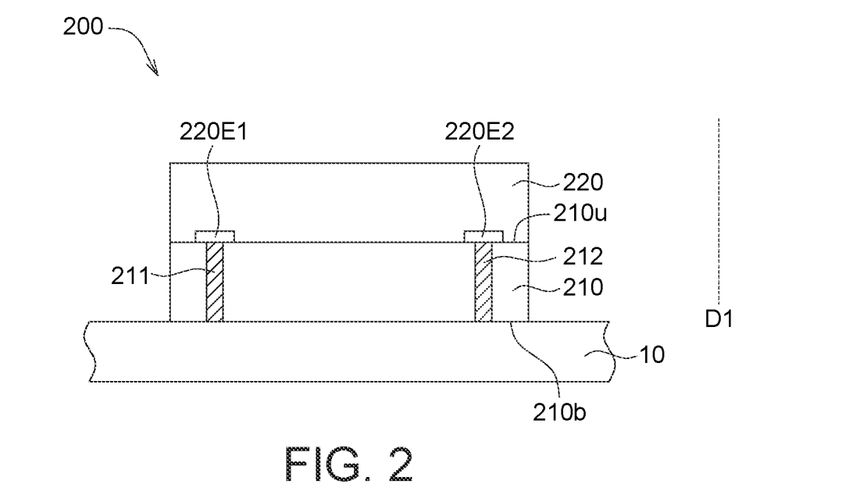
FIG. 2 illustrates a schematic diagram of a cross-sectional view of a semiconductor device according to another embodiment of the present invention.

Referring to FIG. 2, FIG. 2 illustrates a schematic diagram of a cross-sectional view of a semiconductor device 200 according to another embodiment of the present invention. The semiconductor device 200 includes at least one semiconductor component 210 and at least one silicon-based passive component 220. The silicon-based passive component 220 is stacked on the semiconductor component 210 in the thickness direction D1 of the semiconductor component 210.

The semiconductor component 210 is, for example, a PMIC. The semiconductor component 210 is, for example, a die without packaging or a semiconductor package. For example, the semiconductor component 110 is, for example, a WLCSP, a flip-chip BGA, etc. In addition, the semiconductor device 200 may be disposed on and electrically connected to the substrate 10. Although not illustrated, the semiconductor device 200 may be disposed on the substrate 10 by, for example, at least one contact, such as solder ball, bump, pillar, etc.

As illustrated in FIG. 2, the silicon-based passive component 220 includes at least one first electrode 220E1 and at least one second electrode 220E2, and the semiconductor component 210 includes at least one first conductive via 211 and at least one second conductive via 212 electrically connected with the first electrode 220E1 and the second electrode 220E2 respectively. In the present embodiment, the first conductive via 211 and/or the second conductive via 212 is, for example, through-silicon via (TSV). A set of the first electrode 220E1 and the second electrode 220E2 is, for example, an electrode set of one of a plurality of the passive structures in the silicon-based passive component 220.

As illustrated in FIG. 2, the semiconductor component 210 has an upper surface 210u and a lower surface 210b, and the first conductive via 211 and the second conductive via 212 exposed from the upper surface 210u for electrically connected to the silicon-based passive component 220 and exposed from the lower surface 210b for electrically connected to the substrate 10.

Figure 3:
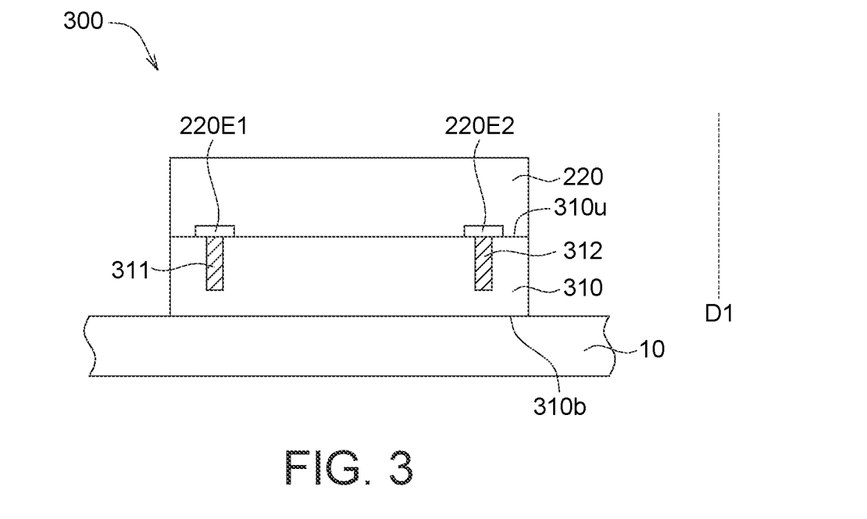
FIG. 3 illustrates a schematic diagram of a cross-sectional view of a semiconductor device according to another embodiment of the present invention.

Referring to FIG. 3, FIG. 3 illustrates a schematic diagram of a cross-sectional view of a semiconductor device 300 according to another embodiment of the present invention. The semiconductor device 300 includes at least one semiconductor component 310 and at least one silicon-based passive component 220. The silicon-based passive component 220 is stacked on the semiconductor component 310 in the thickness direction D1 of the semiconductor component 310.

The semiconductor component 310 is, for example, PMIC. The semiconductor device 300 may be disposed on and electrically connected to the substrate 10. Although not illustrated, the semiconductor device 300 may be disposed on the substrate 10 by, for example, at least one contact, such as solder ball, bump, pillar, etc.

As illustrated in FIG. 3, the silicon-based passive component 220 includes at least one first electrode 220E1 and at least one second electrode 220E2, and the semiconductor component 310 includes at least one first conductive via 311 and at least one second conductive via 312 electrically connected with the first electrode 320E1 and the second electrode 320E2 respectively. In the present embodiment, the first conductive via 311 and/or the second conductive via 312 is, for example, TSV.

As illustrated in FIG. 3, the semiconductor component 310 has an upper surface 310u and a lower surface 310b, and the first conductive via 311 and the second conductive via 312 exposed from the upper surface 210u but not exposed from the lower surface 310b. In other words, the first conductive via 311 and the second conductive via 312 do not extend to the lower surface 310b. Such conductive via is also called "partial through via".

Figure 4:
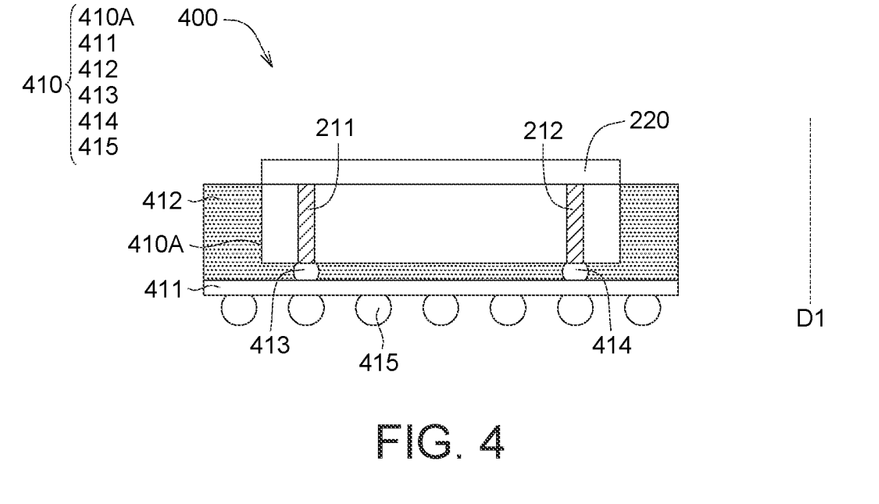
FIG. 4 illustrates a schematic diagram of a cross-sectional view of a semiconductor device according to another embodiment of the present invention.

Referring to FIG. 4, FIG. 4 illustrates a schematic diagram of a cross-sectional view of a semiconductor device 400 according to another embodiment of the present invention. The semiconductor device 400 includes at least one semiconductor component 410 and at least one silicon-based passive component 220. The silicon-based passive component 220 is stacked on the semiconductor component 410 in the thickness direction D1 of the semiconductor component 410.

The semiconductor component 410 is, for example, PMIC. Although not illustrated, the semiconductor device 400 may be disposed on and electrically connected to the substrate 10 (the substrate 10 is illustrated in FIG. 1B) by, for example, at least one contact, such as solder ball, bump, pillar, etc.

As illustrated in FIG. 4, the semiconductor component 410 includes a silicon-based electronic component 410A, a substrate 411, a package body 412, a first contact 413, a second contact 414 and at least one conductive contact 415. The silicon-based electronic component 410A includes the structures similar to or the same as that of the semiconductor component 210 of FIG. 2. For example, the silicon-based electronic component 410A includes at least one contact, such as the first conductive via 211 and the second conductive via 212. The silicon-based electronic component 410A is disposed on the substrate 411 and electrically connected to the substrate 411 through the first contact 413 and the second contact 414. The package body 412 encapsulates the silicon-based electronic component 410A, the first contact 413 and the second contact 414, and exposes the contacts (for example, the first conductive via 211 and the second conductive via 212) of the silicon-based electronic component 410A.

The silicon-based passive component 220 is coupled to the contacts (for example, the first conductive via 211 and the second conductive via 212) of the silicon-based electronic component 410A. Although not illustrated, the silicon-based passive component 220 and the silicon-based electronic component 410A are connected by bump-to-bump. The silicon-based passive component 220 has a size substantially equal to that of the silicon-based electronic component 410A in top view. In another embodiment, the silicon-based passive component 220 has a size greater than or smaller than that of the silicon-based electronic component 410A in top view.

In addition, the package body 412 is, for example, molding compound. The molding compound may be formed of a molding material including, for example, a Novolac-based resin, an epoxy-based resin, a silicone-based resin, or another suitable encapsulant. Suitable fillers also may be included, such as powdered SiO2. The molding material may be applied using any of a number of molding techniques, such as compression molding, injection molding, or transfer molding. In addition, the contacts 413, 414 and/or 415 is, for example, solder ball, bump, pillar, etc. The bump and/or the pillar may be formed of a material including, for example, copper.

Figure 5:
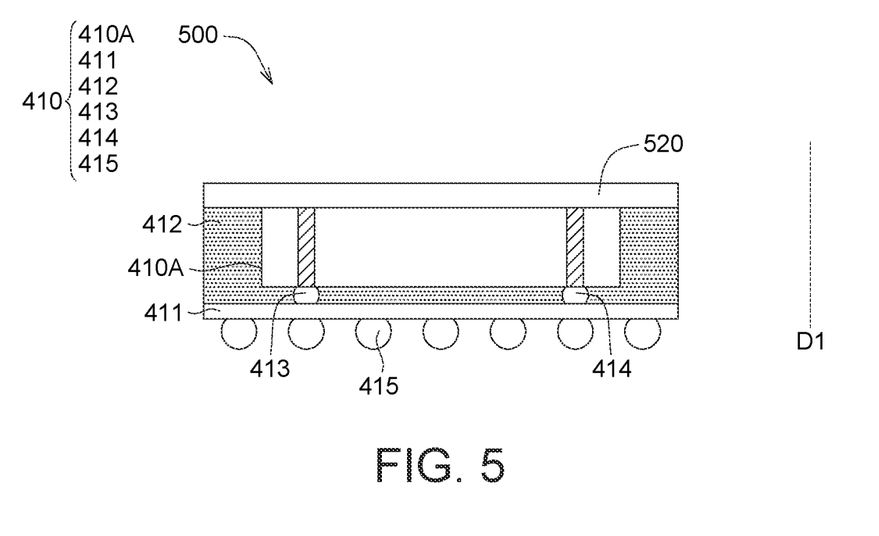
FIG. 5 illustrates a schematic diagram of a cross-sectional view of a semiconductor device according to another embodiment of the present invention.

Referring to FIG. 5, FIG. 5 illustrates a schematic diagram of a cross-sectional view of a semiconductor device 500 according to another embodiment of the present invention. The semiconductor device 500 includes at least one semiconductor component 410 and at least one silicon-based passive component 520. The silicon-based passive component 520 is stacked on the semiconductor component 410 in the thickness direction D1 of the semiconductor component 410.

The semiconductor device 500 includes the structure similar to or the same as that of the semiconductor device 400 except that, for example, the silicon-based passive component 520 has a size substantially equal to that of the semiconductor component 410 in top view.

Although not illustrated, the silicon-based passive component 520 and the silicon-based electronic component 410A are connected by bump-to-bump, and the semiconductor device 500 may be disposed on and electrically connected to the substrate 10 (the substrate 10 is illustrated in FIG. 1B) by, for example, at least one contact, such as solder ball, bump, pillar, etc.

Figure 6:
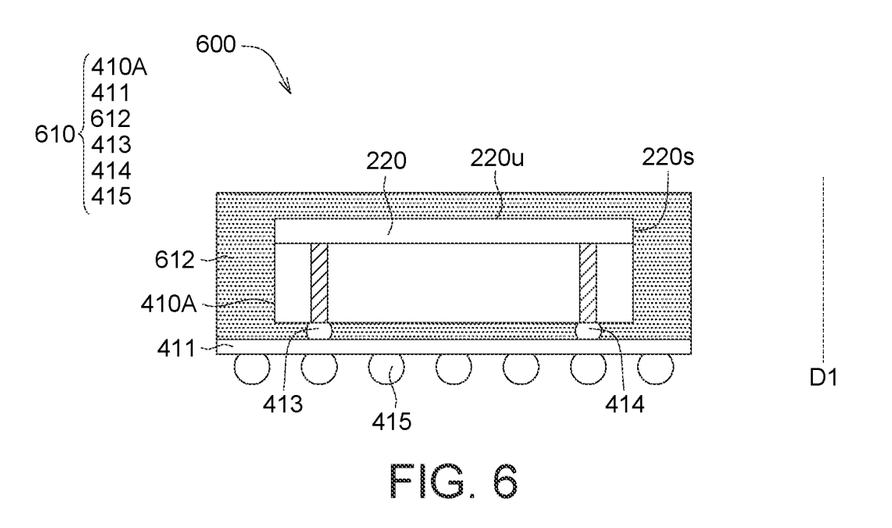
FIG. 6 illustrates a schematic diagram of a cross-sectional view of a semiconductor device according to another embodiment.

Referring to FIG. 6, FIG. 6 illustrates a schematic diagram of a cross-sectional view of a semiconductor device 600 according to another embodiment. The semiconductor device 600 includes at least one semiconductor component 610 and at least one silicon-based passive component 220. The silicon-based passive component 220 is stacked on the semiconductor component 610 in the thickness direction D1 of the semiconductor component 610.

The semiconductor component 610 includes the silicon-based electronic component 410A, the substrate 411, a package body 612, the first contact 413, the second contact 414 and at least one conductive contact 415. The package body 612 may be formed of a material similar to or the same as that of the package body 412 of FIG. 4.

The semiconductor device 600 includes the structure similar to or the same as that of the semiconductor device 500 except that, for example, the package body 612 further encapsulates the silicon-based passive component 220. For example, the package body 612 further covers a top surface 220u and at least one lateral surface 220s of the silicon-based passive component 220.

In addition, the silicon-based passive component 220 has a size substantially equal to that of the silicon-based electronic component 410A in top view. In another embodiment, the silicon-based passive component 220 has a size greater than or smaller than that of the silicon-based electronic component 410A in top view.

Figure 7:
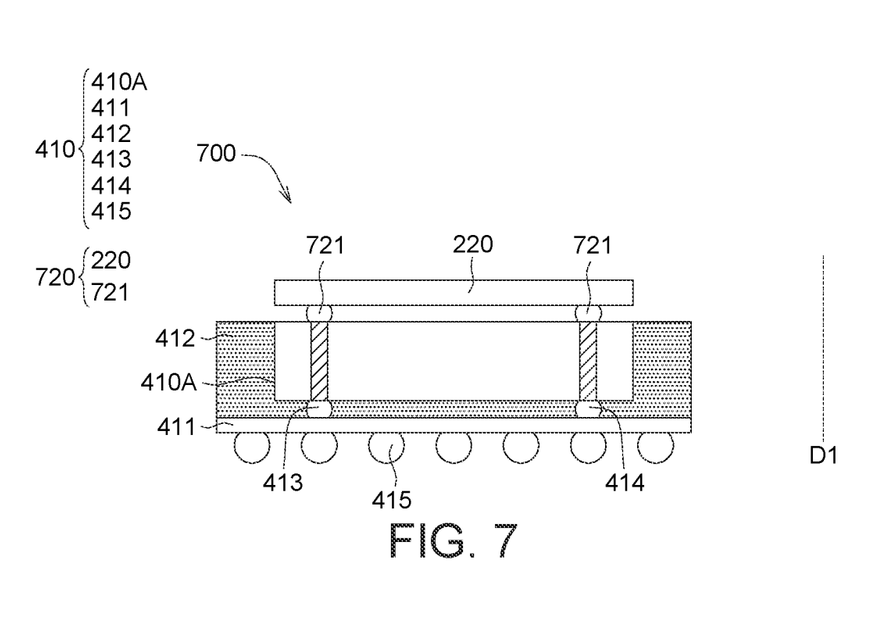
FIG. 7 illustrates a schematic diagram of a cross-sectional view of a semiconductor device according to another embodiment of the present invention.

Referring to FIG. 7, FIG. 7 illustrates a schematic diagram of a cross-sectional view of a semiconductor device 700 according to another embodiment of the present invention. The semiconductor device 700 includes at least one semiconductor component 410 and at least one silicon-based passive component 220. The silicon-based passive component 720 is stacked on the semiconductor component 410 in the thickness direction D1 of the semiconductor component 410.

The silicon-based passive component 720 includes the silicon-based passive component 220 and at least one contact 721. The contact 721 is, for example, solder ball.

The semiconductor device 700 includes the structures similar to or the same as that of the semiconductor device 400 except that, for example, the silicon-based passive component 220 and the semiconductor component 410 are connected through solder ball-to-solder ball. Furthermore, the silicon-based passive component 220 and the semiconductor component 410 through the contact 721.

In another embodiment, the package body 412 of FIG. 7 may encapsulate the silicon-based passive component 720 just like the package body 612 of FIG. 6 encapsulating the silicon-based passive component 220.

Figure 8:
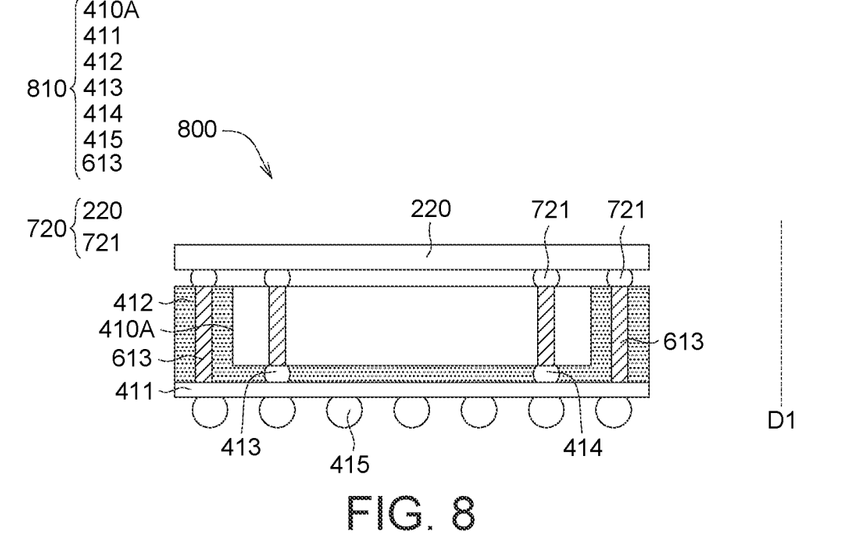
FIG. 8 illustrates a schematic diagram of a cross-sectional view of a semiconductor device according to another embodiment of the present invention.

Referring to FIG. 8, FIG. 8 illustrates a schematic diagram of a cross-sectional view of a semiconductor device 800 according to another embodiment of the present invention. The semiconductor device 800 includes at least one semiconductor component 810 and at least one silicon-based passive component 720. The silicon-based passive component 720 is stacked on the semiconductor component 410 in the thickness direction D1 of the semiconductor component 410.

The semiconductor device 800 includes the structures similar to or the same as that of the semiconductor device 700 except that, for example, the semiconductor component 810 includes the structure different from that of the semiconductor component 410.

As illustrated in FIG. 8, the semiconductor component 810 includes the silicon-based electronic component 410A, the substrate 411, the package body 412, at least one first contact 413, at least one second contact 414, at least one conductive contact 415 and at least one third conductive via 613. The third conductive via 613 passes through the package body 412 to connect the substrate 411 and the silicon-based passive component 720. The silicon-based passive component 720 may be electrically connected to the substrate 411 through the third conductive via 613.

Figure 9:
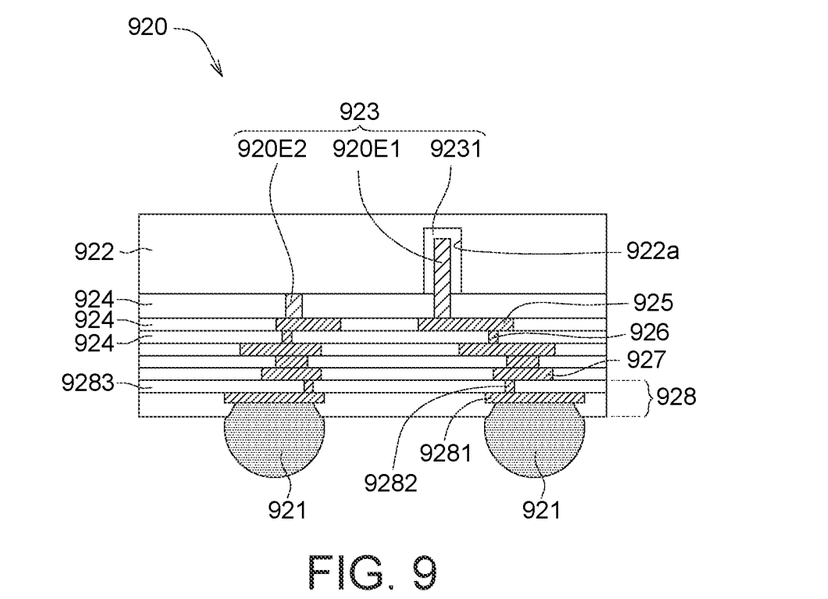
FIG. 9 illustrates a schematic diagram of a cross-sectional view of a silicon-based passive component according to another embodiment of the present invention.

Referring to FIG. 9, FIG. 9 illustrates a schematic diagram of a cross-sectional view of a silicon-based passive component 920 according to another embodiment of the present invention. The silicon-based passive component 920 includes at least one conductive contact 921, a silicon substrate 922, at least one capacitor structure 923, at least one dielectric layer 924, at least one conductive layer 925, at least one conductive via 926, at least one conductive contact 927 and a re-distributed layer (RDL) structure 928.

As illustrated in FIG. 9, the conductive contact 921 has the structures similar to or the same as that of the conductive contact 721. The number of the conductive contacts 921 depends on the number of the capacitor structures 923. For example, the number of the capacitor structures 923 is N, and the number of the conductive contacts 921 is 2N, wherein the N is, for example, a positive integer greater than 1, such as 1, 2, 3 ... 100, 101 ... , 1000, 1001 ... etc. The silicon substrate 922 is, for example, a portion of a silicon wafer. Each capacitor structure 923 includes a first electrode 920E1, a second electrode 920E2 and a dielectric layer 9231, wherein the first electrode 920E1 is formed on a hole 922a of the silicon substrate 922, the dielectric layer 9231 is formed between the first electrode 920E1 and a sidewall of the hole 922a, and the second electrode 920E2 is formed on the silicon substrate 922. One of the dielectric layers 924 covers the first electrode 920E1 and the second electrode 920E2, and exposes a terminal surface of the first electrode 920E1 and a terminal surface of the second electrode 920E2. One of the conductive layers 925 is formed on the dielectric layer 924 and electrically connected to the terminal surface of the first electrode 920E1 and the terminal surface of the second electrode 920E2. Another of the dielectric layers 924 is formed between the adjacent two conductive layers 925. The conductive layer 925 includes at least one trace. The conductive via 926 passes through the dielectric layers 924 and connects the adjacent two conductive layers 925. The conductive contact 927 is formed on the bottommost conductive layer 925 and exposed from the dielectric layer 924 for electrically connecting the RDL 928.

In addition, the first electrode 920E1 and the second electrode 920E2 may be formed of a material including, for example, titanium nitride (TiN). The conductive contact 927 may be formed of a material including, for example, aluminum.

As illustrated in FIG. 9, the RDL 928 includes at least one conductive layer 9281, at least one conductive via 9282 and at least one dielectric layer 9283. The dielectric layer 9283 is formed between the adjacent two conductive layers 9281, and the conductive via 9282 passes through the dielectric layer 9283 and electrically connects the adjacent two conductive layers 9281.

Figure 10:
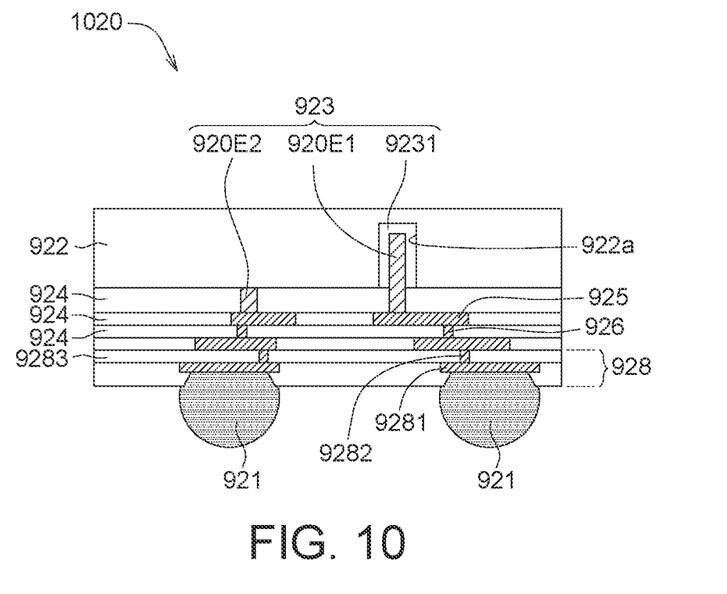
FIG. 10 illustrates a schematic diagram of a cross-sectional view of a silicon-based passive component according to another embodiment of the present invention.

Referring to FIG. 10, FIG. 10 illustrates a schematic diagram of a cross-sectional view of a silicon-based passive component 1020 according to another embodiment of the present invention. The silicon-based passive component 1020 includes at least one conductive contact 921, the silicon substrate 922, at least one capacitor structure 923, at least one dielectric layer 924, at least one conductive layer 925, at least one conductive via 926 and the RDL structure 928. The silicon-based passive component 1020 includes the structures similar to or the same as that of the silicon-based passive component 920 except that, for example, the silicon-based passive component 1020 may omit the conductive contact 927.

Figure 11:
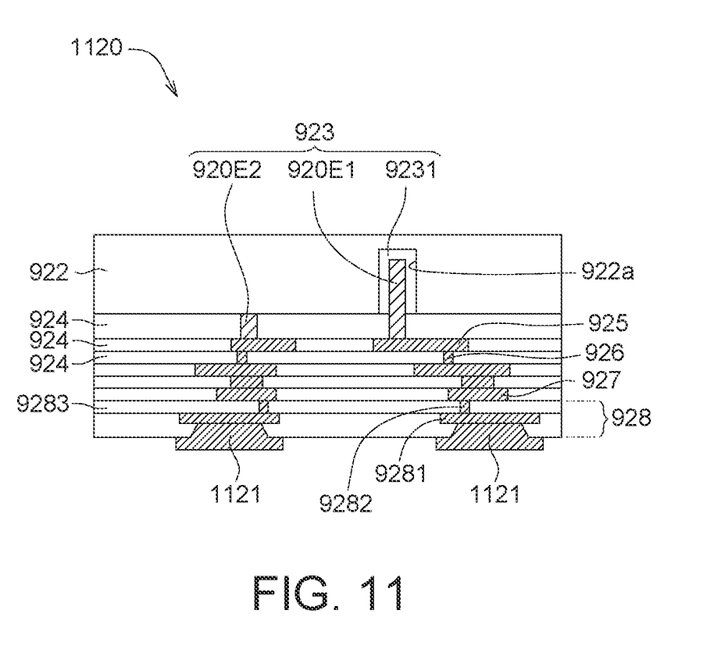
FIG. 11 illustrates a schematic diagram of a cross-sectional view of a silicon-based passive component according to another embodiment of the present invention.

Referring to FIG. 11, FIG. 11 illustrates a schematic diagram of a cross-sectional view of a silicon-based passive component 1120 according to another embodiment of the present invention. The silicon-based passive component 1120 includes at least one conductive contact 1121, the silicon substrate 922, at least one capacitor structure 923, at least one dielectric layer 924, at least one conductive layer 925, at least one conductive via 926, at least one conductive contact 927 and the RDL structure 928.

The silicon-based passive component 1120 includes the structures similar to or the same as that of the silicon-based passive component 920 except that, for example, the conductive contact 1121 of the silicon-based passive component 1120 may be the conductive bump.

Figure 12:
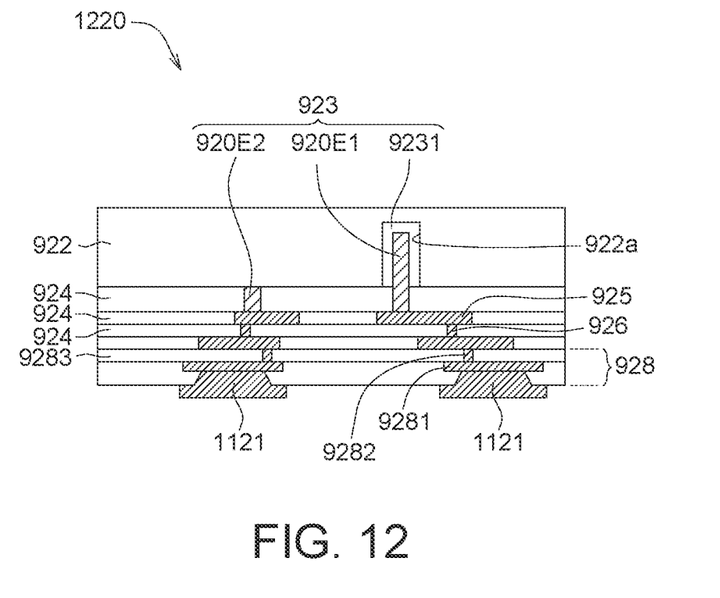
FIG. 12 illustrates a schematic diagram of a cross-sectional view of a silicon-based passive component according to another embodiment.

Referring to FIG. 12, FIG. 12 illustrates a schematic diagram of a cross-sectional view of a silicon-based passive component 1220 according to another embodiment. The silicon-based passive component 1220 includes at least one conductive contact 1121, the silicon substrate 922, at least one capacitor structure 923, at least one dielectric layer 924, at least one conductive layer 925, at least one conductive via 926 and the RDL structure 928.

The silicon-based passive component 1220 includes the structures similar to or the same as that of the silicon-based passive component 1020 except that the conductive contact 1121 of the silicon-based passive component 1220 may be the conductive bump.

Figure 13:
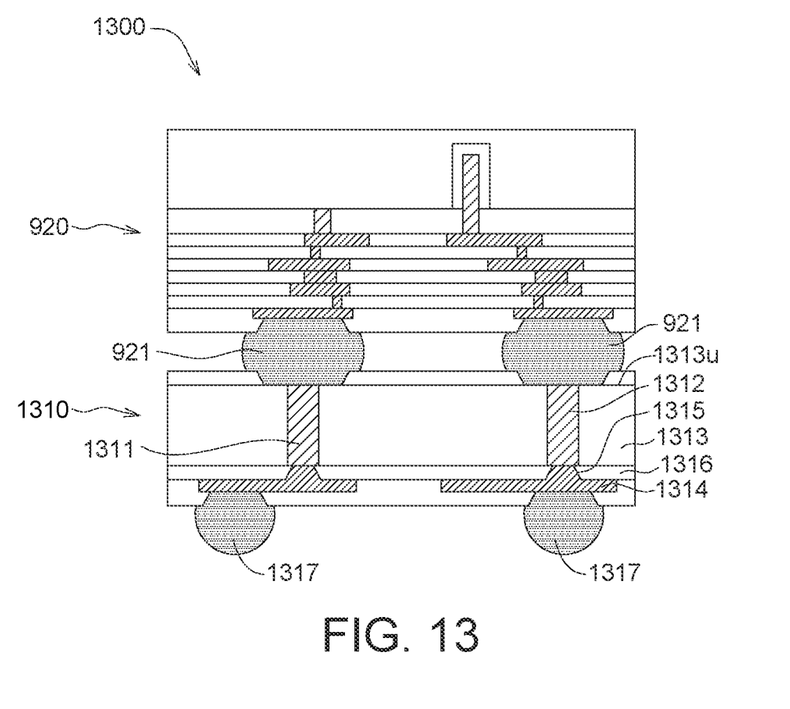
FIG. 13 illustrates a schematic diagram of a cross-sectional view of a semiconductor device according to another embodiment.

Referring to FIG. 13, FIG. 13 illustrates a schematic diagram of a cross-sectional view of a semiconductor device 1300 according to another embodiment. The semiconductor device 1300 includes at least one semiconductor component 1310 and at least one silicon-based passive component 920. The silicon-based passive component 920 is stacked on the semiconductor component 1310 in the thickness direction D1 of the semiconductor component 1310.

In the present embodiment, the silicon-based passive component 920 and the semiconductor component 1310 are connected by solder ball. Furthermore, the semiconductor component 1310 includes a first conductive via 1311, a second conductive via 1312, a silicon substrate 1313, at least one conductive layer 1314, at least one conductive via 1315, at least one dielectric layer 1316 and at least one conductive contact 1317.

The first conductive via 1311 and the second conductive via 1312 are formed on the silicon substrate 1313. The silicon substrate 1313 has an upper surface 1313u and a lower surface 1313b opposite to the upper surface 1313u. The first conductive via 1311 and the second conductive via 1312 extend from the upper surface 1313u toward the lower surface 1313b, but not extend to the lower surface 1313b. The dielectric layer 1316 is formed between the lower surface 1313b and the conductive layer 1314. The conductive vias 1315 pass through the dielectric layer 1316 to connect the conductive layer 1314 and the conductive vias, for example, the first conductive via 1311 and the second conductive via 1312. The conductive contacts 1317 are formed on the conductive layer 1314 for being electrically connected with the first conductive via 1311 and the second conductive via 1312.

In the present embodiment, the silicon-based passive component 920 and the semiconductor component 1310 are connected by the conductive contacts 921, wherein the conductive contacts 921 are, for example, solder ball.

Figure 14:
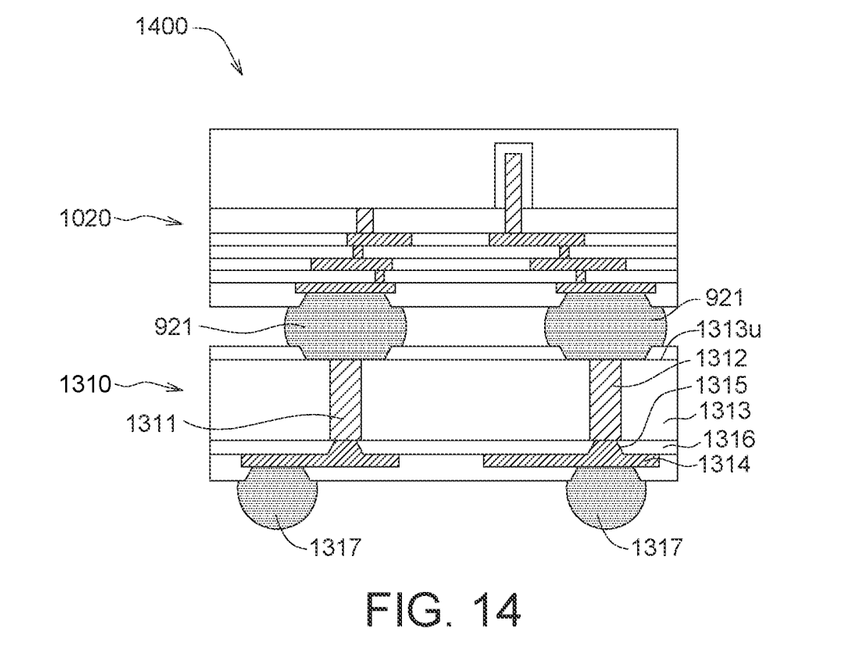
FIG. 14 illustrates a schematic diagram of a cross-sectional view of a semiconductor device according to another embodiment.

Referring to FIG. 14, FIG. 14 illustrates a schematic diagram of a cross-sectional view of a semiconductor device 1400 according to another embodiment. The semiconductor device 1400 includes at least one semiconductor component 1310 and at least one silicon-based passive component 1020. The silicon-based passive component 1020 is stacked on the semiconductor component 1310 in the thickness direction D1 of the semiconductor component 1310.

In the present embodiment, the silicon-based passive component 1020 and the semiconductor component 1310 are connected by the conductive contacts 921.

Figure 15:
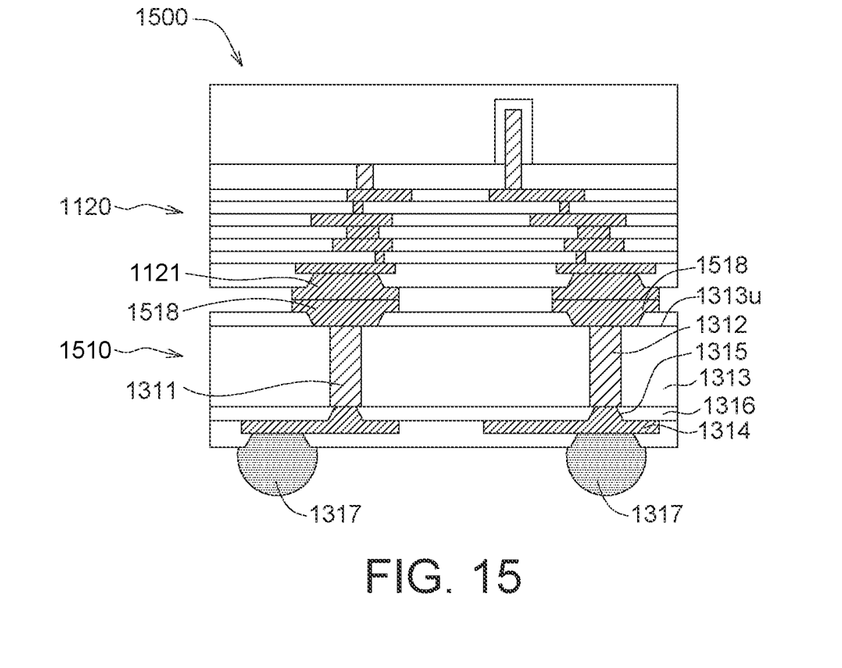
FIG. 15 illustrates a schematic diagram of a cross-sectional view of a semiconductor device according to another embodiment of the present embodiment.

Referring to FIG. 15, FIG. 15 illustrates a schematic diagram of a cross-sectional view of a semiconductor device 1500 according to another embodiment of the present embodiment. The semiconductor device 1500 includes at least one semiconductor component 1510 and at least one silicon-based passive component 1120. The silicon-based passive component 1120 is stacked on the semiconductor component 1510 in the thickness direction D1 of the semiconductor component 1510.

In the present embodiment, the silicon-based passive component 1120 and the semiconductor component 1510 are connected by bump-to-bump. Furthermore, the semiconductor component 1510 includes the structures similar to or the same as that of the semiconductor component 1510 except that, for example, the semiconductor component 1510 further includes at least one conductive contact 1518. The conductive contact 1518 is, for example, bump. The conductive contact 1121 of the silicon-based passive component 1120 and the conductive contact 1518 of the semiconductor component 1510 are connected by bump-to-bump technique.

Figure 16:
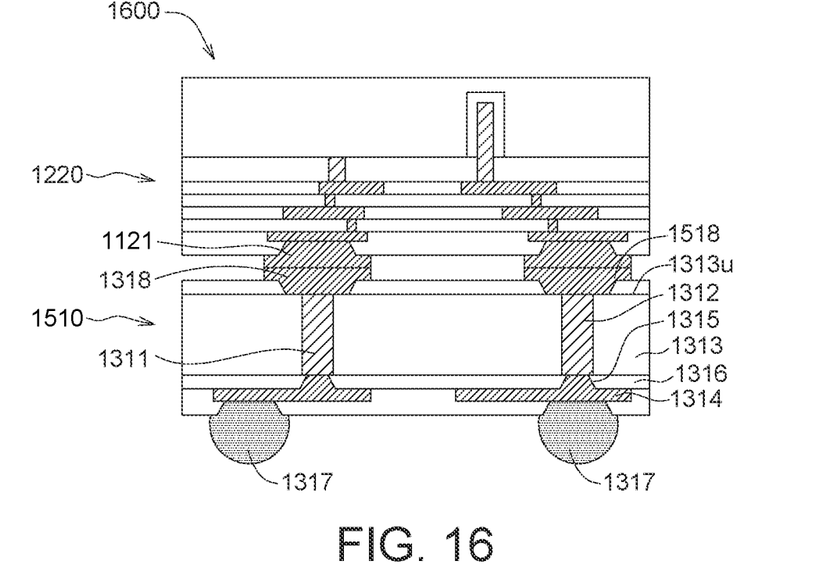
FIG. 16 illustrates a schematic diagram of a cross-sectional view of a semiconductor device according to another embodiment of the present embodiment.

Referring to FIG. 16, FIG. 16 illustrates a schematic diagram of a cross-sectional view of a semiconductor device 1600 according to another embodiment of the present embodiment. The semiconductor device 1600 includes at least one semiconductor component 1510 and at least one silicon-based passive component 1220. The silicon-based passive component 1220 is stacked on the semiconductor component 1510 in the thickness direction D1 of the semiconductor component 1510.

In the present embodiment, the conductive contact 1121 of the silicon-based passive component 1220 and the conductive contact 1518 of the semiconductor component 1510 are connected by bump-to-bump technique.

Figure 17:
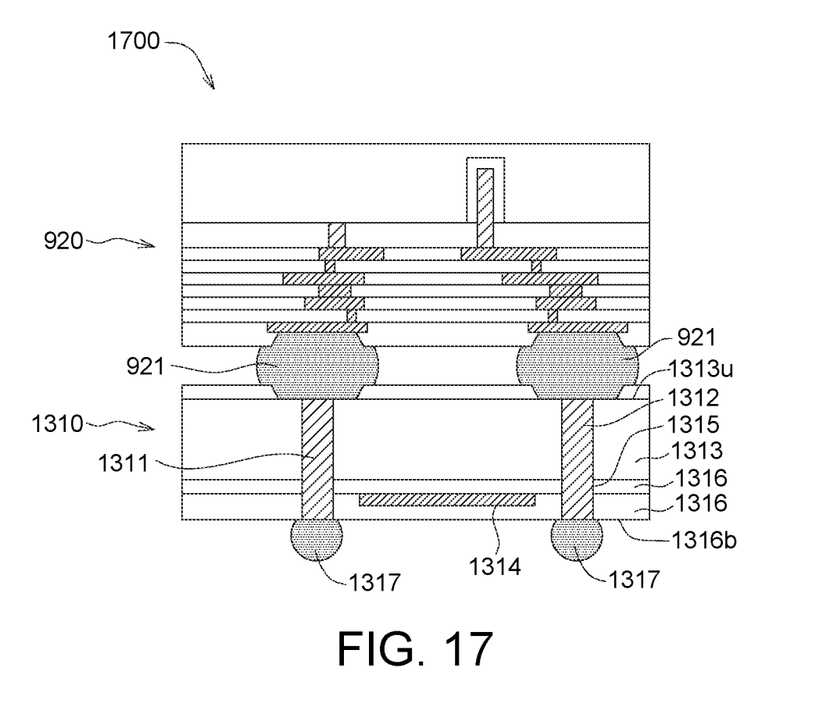
FIG. 17 illustrates a schematic diagram of a cross-sectional view of a semiconductor device according to another embodiment of the present embodiment.

Referring to FIG. 17, FIG. 17 illustrates a schematic diagram of a cross-sectional view of a semiconductor device 1700 according to another embodiment of the present embodiment. The semiconductor device 1700 includes at least one semiconductor component 1710 and at least one silicon-based passive component 920. The silicon-based passive component 920 is stacked on the semiconductor component 1710 in the thickness direction D1 of the semiconductor component 1710.

The semiconductor component 1710 includes the structures similar to or the same as that of the semiconductor component 1310 except that, for example, at least one of the first conductive via 1311 and the second conductive via 1312 passes through the dielectric layers 1316, extends to a lower surface 1316b of the bottommost dielectric layer 1316, and is exposed from the lower surface 1316b.

To sum up, the semiconductor device includes at least one semiconductor component and at least one silicon-based passive component, wherein the silicon-based passive component is stacked on the semiconductor component in the thickness direction of the semiconductor component. The silicon-based passive component may include at least one passive structure, such as at least one capacitance, at least one resistor and/or at least one inductance, and/or the silicon-based passive component 120 may provide at least one input/output contact. As a result, the silicon-based passive component may support the semiconductor component with high input/output density. In addition, due to the silicon-based passive component being stacked above the semiconductor component, the size (or top area) of the semiconductor device may be reduced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A semiconductor device, comprising:
  a semiconductor component; and
  a silicon-based passive component stacked on the semiconductor component in a thickness direction of the semiconductor component,
  wherein the silicon-based passive component comprises a first electrode and a second electrode and the semiconductor component comprises a first conductive via and a second conductive via electrically connected with the first electrode and the second electrode respectively, and
  wherein the silicon-based passive component comprises:
  a silicon substrate;
  a capacitor structure formed within the silicon substrate;
  a dielectric layer formed over the silicon substrate and exposing the capacitor structure; and
  a Redistribution Layer (RDL) formed over the dielectric layer.

2. The semiconductor device as claimed in claim 1, wherein the semiconductor component has an upper surface and a lower surface, and the first conductive via and the second conductive via exposed from the upper surface and the lower surface.

3. The semiconductor device as claimed in claim 1, wherein the semiconductor component has an upper surface and a lower surface, and the first conductive via and the second conductive via exposed from the upper surface but not exposed from the lower surface.

4. The semiconductor device as claimed in claim 1, wherein the silicon-based passive component is a silicon-based capacitor.

5. The semiconductor device as claimed in claim 1, wherein the semiconductor component is a die without packaging.

6. The semiconductor device as claimed in claim 1, wherein the semiconductor component is a PMIC.

7. The semiconductor device as claimed in claim 1, wherein the semiconductor component is a semiconductor package.

8. The semiconductor device as claimed in claim 7, wherein the semiconductor package comprises:
  a silicon-based electronic component comprising a contact;
  a package body encapsulating the silicon-based electronic component and exposing the contact of the silicon-based electronic component;
  wherein the silicon-based passive component is coupled to the contact of the silicon-based electronic component.

9. The semiconductor device as claimed in claim 7, wherein the semiconductor package comprises:
  a silicon-based electronic component on which the silicon-based passive component is stacked;
  a package body encapsulating the silicon-based electronic component and the silicon-based electronic component.

10. The semiconductor device as claimed in claim 1, wherein the semiconductor component has a first lateral surface, the silicon-based passive component has a second lateral surface, and the second lateral surface does not protrude with respect to the first lateral surface.

11. The semiconductor device as claimed in claim 1, wherein the silicon-based passive component comprises a plurality of passive structures.

12. The semiconductor device as claimed in claim 11, wherein the silicon-based passive component comprises a first electrode and a second electrode, and the semiconductor component comprises a first conductive via and a second conductive via electrically connected with the first electrode and the second electrode, respectively.

13. The semiconductor device as claimed in claim 12, wherein the semiconductor component has an upper surface and a lower surface and the first conductive via and the second conductive via exposed from the upper surface and the lower surface.

14. The semiconductor device as claimed in claim 12, wherein the semiconductor component has an upper surface and a lower surface and the first conductive via and the second conductive via exposed from the upper surface but not exposed from the lower surface.

* * * * *